United States Patent [19]
Yamada et al.

[11] 4,392,114
[45] Jul. 5, 1983

[54] AUDIO DEVICE HAVING A TONE CONTROL CANCELLING CIRCUIT

[75] Inventors: Shigeru Yamada; Kazuya Ohhara, both of Toda, Japan

[73] Assignee: Clarion Co., Ltd., Tokyo, Japan

[21] Appl. No.: 263,837

[22] Filed: May 15, 1981

[30] Foreign Application Priority Data

May 21, 1980 [JP] Japan ................................. 55-66396

[51] Int. Cl.³ ............................................ H03H 7/01
[52] U.S. Cl. .................................. 333/28 T; 179/1 D
[58] Field of Search ..................... 333/28 T; 179/1 D; 455/233

[56] References Cited

U.S. PATENT DOCUMENTS 3,531,596  9/1970  Yagher, Jr. .................. 333/28 T X

*Primary Examiner*—Paul L. Gensler
*Attorney, Agent, or Firm*—Flynn, Thiel, Boutell & Tanis

[57] ABSTRACT

An audio device comprises an equalizer circuit, a control circuit for controlling characteristics of volume, balance, bass and treble, control signals producing circuit which produces signals for controlling said characteristics and a reference voltage producing circuit which produces reference voltage for carrying out the characteristics controls, in which the control circuit is forcedly provided with bass and treble control signals having half values of the reference voltage upon operation of the equalizer circuit.

5 Claims, 5 Drawing Figures

AUDIO DEVICE HAVING A TONE CONTROL CANCELLING CIRCUIT

BACKGROUND OF THE INVENTION

1. Field of the Invention

This invention relates to an audio device and particularly to a tone control cancelling circuit in which tone control is forcedly cancelled on operating an equalizer unit.

2. Description of Prior Art

In a conventional radio, stereo and the like for use in a car having an electronic control circuit for adjusting volume and tone (balance, bass and treble), the control circuit has been operative even upon operating an equalizer unit. Therefore, the control circuit has been liable to be mis-operated coincidentally with the operation of the equalizer unit. If it is once mis-operated, the bass and treble characteristics values, particularly, of the tone characteristic value turn out to deviate from predetermined level values, whereby there occurs necessity of resetting level values.

At the same time, such deviation causes the tone characteristic value to exceed the designed allowance of the device to thereby produce vibration and wave form distortion which may make a user uncomfortable.

SUMMARY OF THE INVENTION

In accordance with the present invention, in order to eliminate the above mentioned drawbacks in a conventional art, there is provides an audio device comprising: an equalizer means; a tone control means having at least bass and treble regulating means; an amplifier supplied with outputs from said tone control means; a reference control means; a first switch for applying input signals directly or through said equalizer means to said tone control means; a second switch which connects said bass and treble regulating means to said tone control means when said input signals are directly applied to said tone control means and disconnect said bass and treble regulating means from said tone control means when said input signals are applied to said tone control means through said equalizer means to thereby connect said reference control means to said tone control means.

DETAILED DESCRIPTION OF THE PREFERRED EMBODIMENT

Figure 1:
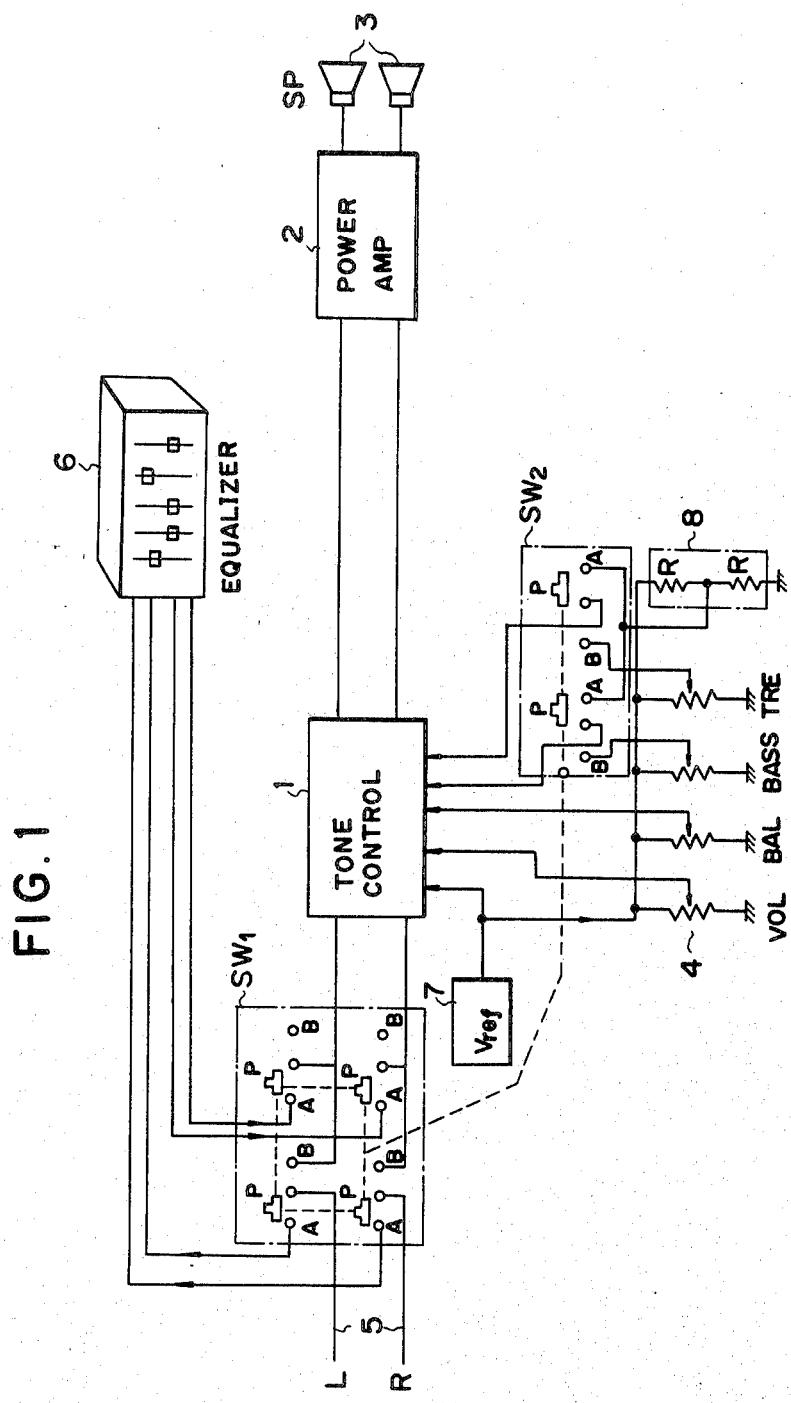
FIG. 1 is a circuit diagram representing an embodiment according to the present invention; and, FIGS. 2–5 are graphs for explaining the present invention.

The present invention is now described in detail, referring to the drawings.

FIG. 1 is a circuit diagram of a car-stereo representing an embodiment according to the present invention.

The reference numeral 1 designates a volume and tone control circuit for controlling volume and tone, 2 a power amplifier, 3 a speaker, 4 a control circuit having control means of volume (VOL), balance (BAL), bass (BASS) and treble (TRE), $SW_1$ and $SW_2$ switches each operative simultaneously with each other, P is the switches $SW_1$, $SW_2$ contacts, 5 an input line, 6 an equalizer unit, 7 a reference voltage producing means for control circuit and 8 a reference voltage control means, respectively.

With this arrangement, when the contacts P of the switches $SW_1$, $SW_2$ each is connected to the contact point B, an input signal supplied from the input line 5 is applied to the volume and tone control circuit 1 without passing an equalizer unit 6, as in a conventional one. Thus, volume and tone come to be controlled and the resulting output is applied to the amplifier 2.

On the other hand, when the contacts P each is connected to the contact point A, the equalizer unit 6 comes out to be operative, whereby the input signal supplied from the input line 5 is applied to the equalizer unit 6. Thus, the resulting output signal from the equalizer unit 6 is applied to the volume and tone control circuit 1. At the same time, the control means for bass (BASS) and treble (TRE) comes to be cancelled whereby divided reference voltage is forcedly applied to the control circuit 1 through the switch $SW_2$. In this case, such divided reference voltage may be obtained by dividing the reference voltage Vref for carrying out each control action into $\frac{1}{2}$ Vref using two resistors R, for example, of the reference conrol means 8. Further, the reference voltage producing means 7 is arranged to supply each control means with reference voltage between O and Vref to thereby operate these control means.

Figure 2:
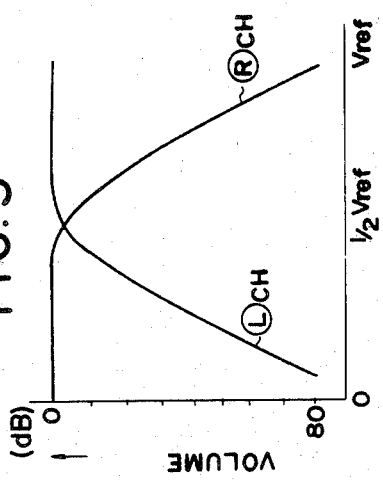
Figure 3:
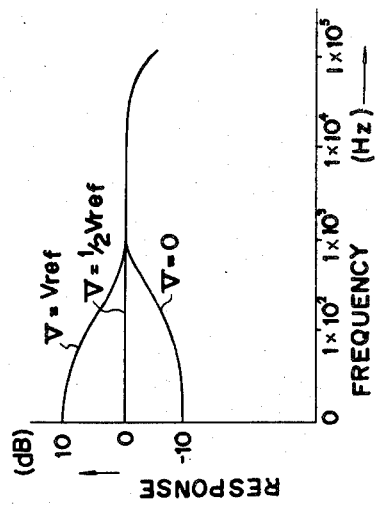

FIGS. 2–5 are graphs for explaining the present invention. FIG. 2 shows interrelation between control voltage and volume, FIG. 3 interrelation between right and left volumes and control voltage in a stereo, FIG. 4 response characteristics of the treble control circuit obtained under a several values of control voltage and, FIG. 5 response characteristics of the bass control circuit obtained under a several values of control voltage, respectively.

Figure 4:
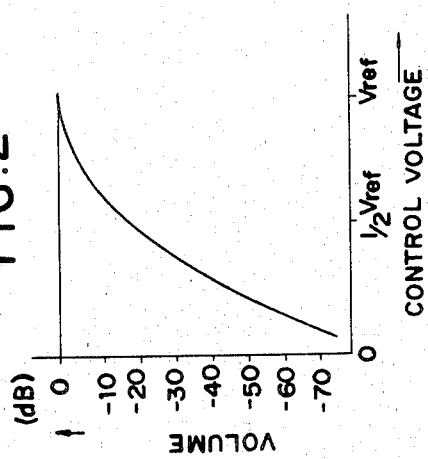
Figure 5:
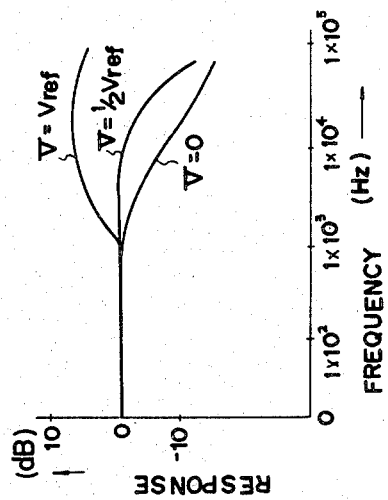

As clearly shown in FIGS. 4 and 5, if control signal voltage V in each of the treble characteristic and the bass characteristic is determined at $V = \frac{1}{2}$ Vref as mentioned above, their response levels are kept flat. Therefore, even when the volume and tone control circuit 1 is capable of turning on upon operating the equalizer unit to be thereby mis-operated, the circuit 1 is forcedly cancelled whereby each of the bass characteristic and the treble characteristic with a supply of another control signal voltage keeps its response level flat. Thus, the problems in the conventional art can be resolved.

At the same time, there does not occur any operation exceeding a designed allowance of such a device, and, the device can be kept in its proper operational condition resulting in not making a user uncomfortable.

We claim:

1. An audio device comprising:
   an equalizer means;
   a tone control means having at least bass and treble regulating means;
   an amplifier supplied with outputs from said tone control means;
   a reference control means;
   a first switch for applying input signals directly or through said equalizer means to said tone control means;
   a second switch which connects said bass and treble regulating means to said tone control means when said input signals are directly applied to said tone control means and disconnects said bass and treble regulating means from said tone control means when said input signals are applied to said tone control means through said equalizer means to thereby connect said reference control means to said tone control means.

2. An audio device as claimed in claim 1 wherein said reference control means is arranged to produce voltage of a half value of the reference voltage applied to said bass and treble regulating means.

3. An audio device as claimed in claim 1 wherein said second switch is simultaneously actuated with said first switch and has two pairs of terminals, one being connected to said bass and treble regulating means, the other being connected to said reference control means, whereby said one and said other of said pairs of terminals are alternatively connected to said tone control means.

4. An audio device as claimed in claim 1 further comprising a control reference voltage producing means connected to said bass and said treble regulating means and reference control means, wherein said reference control means consists of two resistors of the same resistance connected in series.

5. An audio device as claimed in claim 1 wherein said first switch has a first, a second and a third pair of terminals, said first and second pairs of terminals each being connected to an input and an output of said equalizer means, respectively, and said third pair of terminals being connected to an input of said tone control means, to thereby alternatively apply input signals thereof to said first and second pairs of terminals, and, alternatively connect said third pair of terminals to an input of said tone control means.

* * * * *